United States Patent
Miller et al.

(10) Patent No.: US 6,765,710 B2
(45) Date of Patent: Jul. 20, 2004

(54) INTERFERENCE TABS FOR AVOIDING SNAPDOWN OF OPTICAL MEMBRANE AND FABRICATION PROCESS

(75) Inventors: Michael F. Miller, Hollis, NH (US); Dale C. Flanders, Lexington, MA (US)

(73) Assignee: Axsun Technologies, Inc., Billerica, MA (US)

(*) Notice: Subject to any disclaimer, the term of this patent is extended or adjusted under 35 U.S.C. 154(b) by 172 days.

(21) Appl. No.: 10/016,797

(22) Filed: Dec. 10, 2001

(65) Prior Publication Data

US 2002/0072015 A1 Jun. 13, 2002

Related U.S. Application Data

(60) Provisional application No. 60/254,728, filed on Dec. 11, 2000.

(51) Int. Cl.⁷ .......................... G02B 26/00; G02B 26/08
(52) U.S. Cl. ...................... 359/290; 359/224; 359/223; 359/291
(58) Field of Search .............................. 359/290, 224, 359/223, 198, 291, 199, 238

(56) References Cited

U.S. PATENT DOCUMENTS 5,459,610 A    10/1995  Bloom et al. ............... 359/572
5,739,941 A *  4/1998   Knipe et al. ................ 359/224
6,594,057 B1 * 7/2003   Drake et al. ................ 359/224
2002/0149071 A1 * 10/2002 Shim ......................... 257/415

OTHER PUBLICATIONS

Gui, C., et al., "Nanomechanical Optical Devices Fabricated with Aligned Wafer Bonding," MESA Research Institute, University of Twente, The Netherlands, pp. 482–487 (1998).

* cited by examiner

Primary Examiner—Tim Thompson
(74) Attorney, Agent, or Firm—J. Grant Houston

(57) ABSTRACT

Tabs or stops are integrated into a membrane structure to prevent its snapdown. Features comprising two surfaces separated by a distance equal to the maximum desired range of movement are produced. When the two surfaces contact, the motion of the structure is arrested or greatly diminished by increasing its rigidity. For an electrostatically actuated MEMS structure, these features can be used to limit the range of motion such that pull-in or snapdown is avoided, greatly enhancing the reliability of the device. One key design feature is that the two contacting surfaces are maintained at the same electrical potential avoiding problems associated with electrostatic cavity discharge.

6 Claims, 6 Drawing Sheets

INTERFERENCE TABS FOR AVOIDING SNAPDOWN OF OPTICAL MEMBRANE AND FABRICATION PROCESS

This application claims benefit of Provisional Application No. 60/254,728, filed on Dec. 11, 2000.

BACKGROUND OF THE INVENTION

Microelectromechanical system (MEMS) membranes are used in a spectrum of optical applications. For example, they can be coated to be reflective and then paired with a stationary mirror to form a tunable Fabry-Perot (FP) cavity/filter. They can also be used as stand-alone reflective components to define the end of a laser cavity, for example. Optical surfaces, such as curved, binary, or diffractive surfaces, can be fabricated on the membranes to create movable mirrors and lenses.

The MEMS membranes are typically produced by depositing a membrane structure over a sacrificial layer, which has been deposited on a support structure. This sacrificial layer is subsequently etched away, or otherwise removed, to produce a suspended membrane structure in a release process. Often the membrane layer is a metal or silicon compound and the sacrificial layer can be polyimide, for example.

Typically, membrane deflection is achieved by applying a voltage between the membrane and a fixed electrode on the support or an air bridge structure, for example. Electrostatic attraction moves the membrane in the direction of the fixed electrode as a function of the applied voltage. This results in changes in the reflector separation of the FP filter, cavity length in the case of a laser, or lens/mirror position.

SUMMARY OF THE INVENTION

One chronic problem associated with MEMS membranes in general is stiction. Specifically, if deflected sufficiently to contact an adjoining surface, the membranes can "snapdown" or adhere to that surface because of atomic-level forces, for example. One example is a suspended membrane structure that is designed to provide out of plane motion using electrostatic actuation. If the applied voltage exceeds that required to deflect the membrane to its instability point (roughly one third of the initial gap), then the membrane can snapdown. If the atomic-level bonding forces exceed the restoring force of the membrane structure, the membrane will remain "stuck" to the fixed electrode. Another scenario that produces a similar result is triggered by an acceleration load, when the load is sufficient to deflect the membrane to its full extent, as in a shock test.

One path to solving stiction problems includes the addition of surface features and/or coatings to the membrane, or the stationary surface adjacent the membrane, to allow the membrane to recover from a snapdown event. The contact area between the two surfaces can be reduced so that the bonding forces are reduced. Roughening the surfaces is an example of this approach as is producing discrete protrusions on either surface. A number of risks, however, are inherent with this solution. Surface roughening is not appropriate for all applications. Stiction bumps can become damaged in the event of snapdown since the electrical potential across the electrostatic cavity will be discharged through the small contact area of the bump. This can lead to bump damage or bump welding.

Another path focuses on reducing the surface energy of contacting surfaces by using a chemical treatment. Antistiction coatings, however, do not appear to be a robust solution, merely incrementally improving the survivability of membranes to snapdown—the coatings can also be relatively slow acting. They may also be incompatible with required optical coatings, such as dielectric antireflective (AR) coatings or highly reflective (HR) coatings for example, or damage active semiconductor devices because of organic content.

The present invention concerns the integration of tabs or stops that prevent snapdown of a deflectable membrane structure. Features comprising two surfaces separated by a distance equal to the maximum desired range of movement are produced. When the two surfaces contact, the motion of the structure is arrested or greatly diminished. For an electrostatically actuated MEMS structure, these features can be used to limit the range of motion such that pull-in or snapdown is avoided, greatly enhancing the reliability of the device. One key design feature is that the two contacting surfaces can be maintained at the same, or near the same, electrical potential avoiding problems associated with electrostatic discharge.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE PREFERRED EMBODIMENTS

Figure 1:
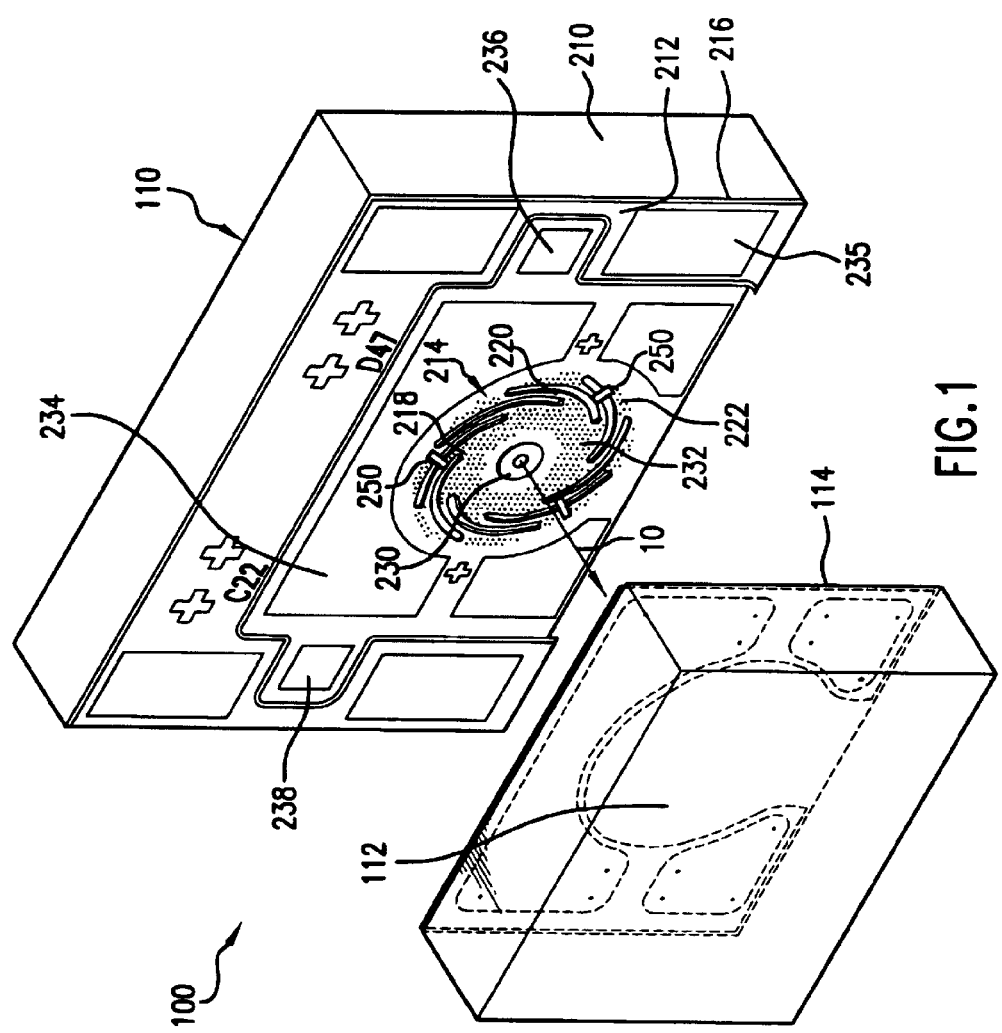
FIG. 1 is a perspective, exploded view of a tunable filter comprising an optical membrane device, according to the present invention.

FIG. 1 shows a Fabry-Perot tunable filter 100 comprising an optical membrane device 110, which has been constructed according to the principles of the present invention.

Generally, in the FP filter device 100, a spacer device 114 that separates the mirror device 112 from the membrane structure 214 to thereby define a Fabry-Perot (FP) cavity.

The optical membrane device 110 comprises handle material 210. Preferably, the handle material is wafer material such as from a silicon wafer, which has been singulated into the illustrated device.

An optical membrane layer 212 is added to the handle wafer material 210. The membrane structure 214 is formed in this optical membrane layer 212. This optical membrane layer is currently between 5 and 10 micrometers in thickness. Preferably, it is between 6 and 8 micrometers in thickness.

An insulating layer 216 separates the optical membrane layer 212 from the handle wafer material 210. During manufacture, this insulating layer functions as a sacrificial/release layer, which is partially removed to release the membrane structure 214 from the handle wafer material 210. In the preferred embodiment, this insulating layer is between 3 and 6 micrometers in thickness. In the current embodiment, it is greater than 3 micrometers, preferably greater than 3.5 μm, in thickness, but less than 5 micrometers.

In a current embodiment, the membrane layer 212 is silicon. Currently, the membrane layer is manufactured from a silicon wafer that has been bonded to the insulating layer 216 under elevated heat and pressure. Other alternatives are polycrystalline silicon or silicon nitride, which have been deposited on the insulating layer.

In the current embodiment, the membrane structure 214 comprises a body portion 218. The optical axis 10 of the device 100 passes concentrically through this body portion 218 and orthogonal to a plane defined by the membrane layer 212. A diameter of this body portion 218 is preferably 300 to 600 micrometers, currently it is about 500 micrometers.

Tethers 220 of the membrane structure 214 extend radially from the body portion 218 to the membrane structure's outer portion 222, which comprises the ring where the tethers 220 terminate. In the current embodiment, a spiral tether pattern is used.

An optical coating dot 230 is typically deposited on the body portion 218 of the membrane structure 214. In the implementation as a Fabry-Perot filter or other reflecting membrane, the optical dot 230 is preferably a highly reflecting (HR) dielectric mirror stack. This yields a highly reflecting, but low absorption, structure that is desirable in, for example, the manufacture of high finesse Fabry-Perot filters. In applications relying on transmission, both sides of the membrane structure 214 are a typically coated with dielectric AR coatings.

In the illustrated embodiment, artifacts of the manufacture of the membrane structure 214 are etchant or release holes 232. These holes allow an etchant to pass through the body portion 218 of the membrane structure 214 to assist in the removal of the insulating layer 216 during the release process.

In the illustrated embodiment, metal pads 234 are deposited on the proximal side of the membrane device 110. These are used to solder bond, for example, the spacing structure 114 onto the membrane device 110. Of course, it could be avoided if the spacing structure 214 is formed to be integral with the membrane device 110, instead of integral with the mirror device 112, as shown.

Bond pads 235 are useful when installing the filter 100 on a micro-optical bench, for example. Also provided are a membrane layer wire bond pad 236 and a handle wafer wire bond pad 238. The membrane layer bond pad 236 is a wire bonding location for electrical control of the membrane layer 212. The handle wafer bond pad 238 is a wire bond pad for electrical access to the handle wafer material 210.

According to the present invention, tabs or stops 250 are provided that prevent snapdown of a deflectable membrane structure 214 against the handle material 210. The tabs 250 comprise a feature that is connected to the membrane structure 214, or adjacent the structure, that comes into contact with another portion of the membrane layer 212 when the membrane structure 214 has deflected a predetermined, maximum desirable, distance.

In the embodiment of FIG. 1, the tabs 250 are attached to the tethers 220 of the membrane structure 210 and extend to overhang the outer portion 222 of the membrane structure 214. When fully deflected, the tabs 250 of the membrane structure contact the outer portion to thereby increase the rigidity of the structure, thus preventing further deflection and snapdown against the handle wafer 210.

Figure 2:
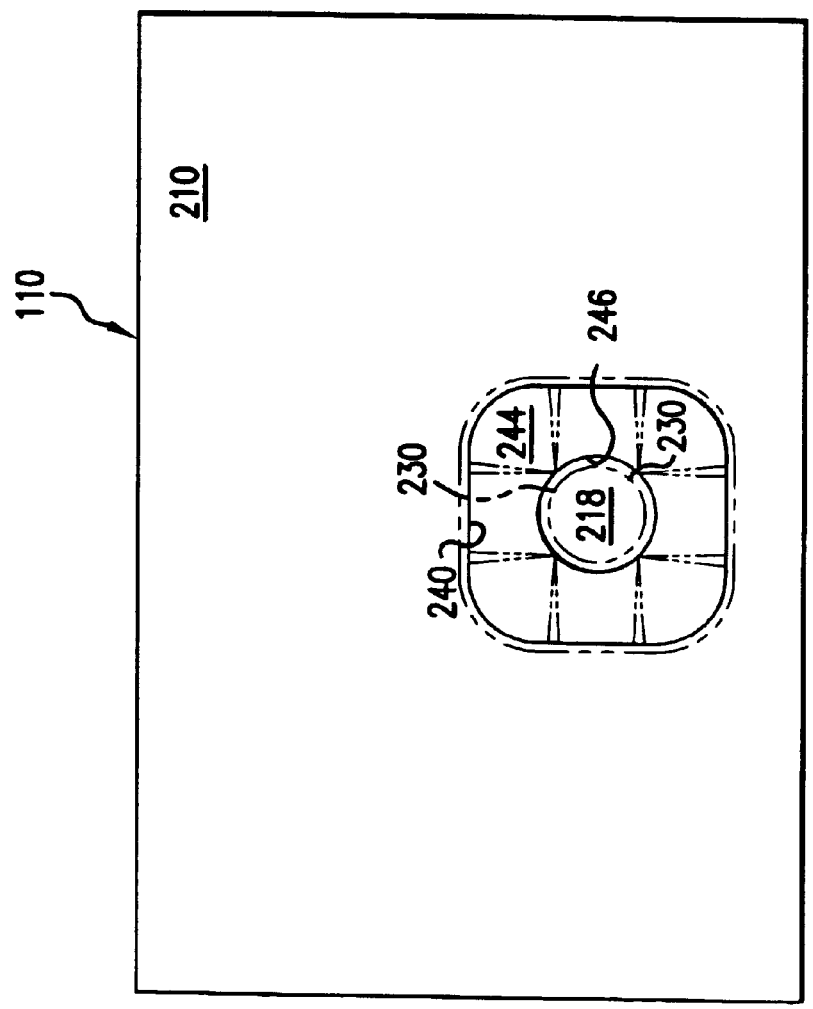
FIG. 2 is an elevation view of the distal side of the inventive optical membrane device showing the optical port.

FIG. 2 shows an optical port 240. It is provided, in some embodiments, extending from a distal side of the handle wafer material 210 to the membrane structure 214. Whether or not this optical port 240 is required depends upon the transmissivity of the handle wafer material 210 at the optical wavelengths over which the membrane structure 110 must operate. Typically, with no port, the handle wafer material along the optical axis must be AR coated.

Specifically, the optical port 240 has generally inward sloping sidewalls 244 that end in the port opening 246. As a result, looking through the distal side of the handle wafer material, the body portion 218 of the membrane structure 214 is observed, with a concentric optical coating 230.

Figure 3:
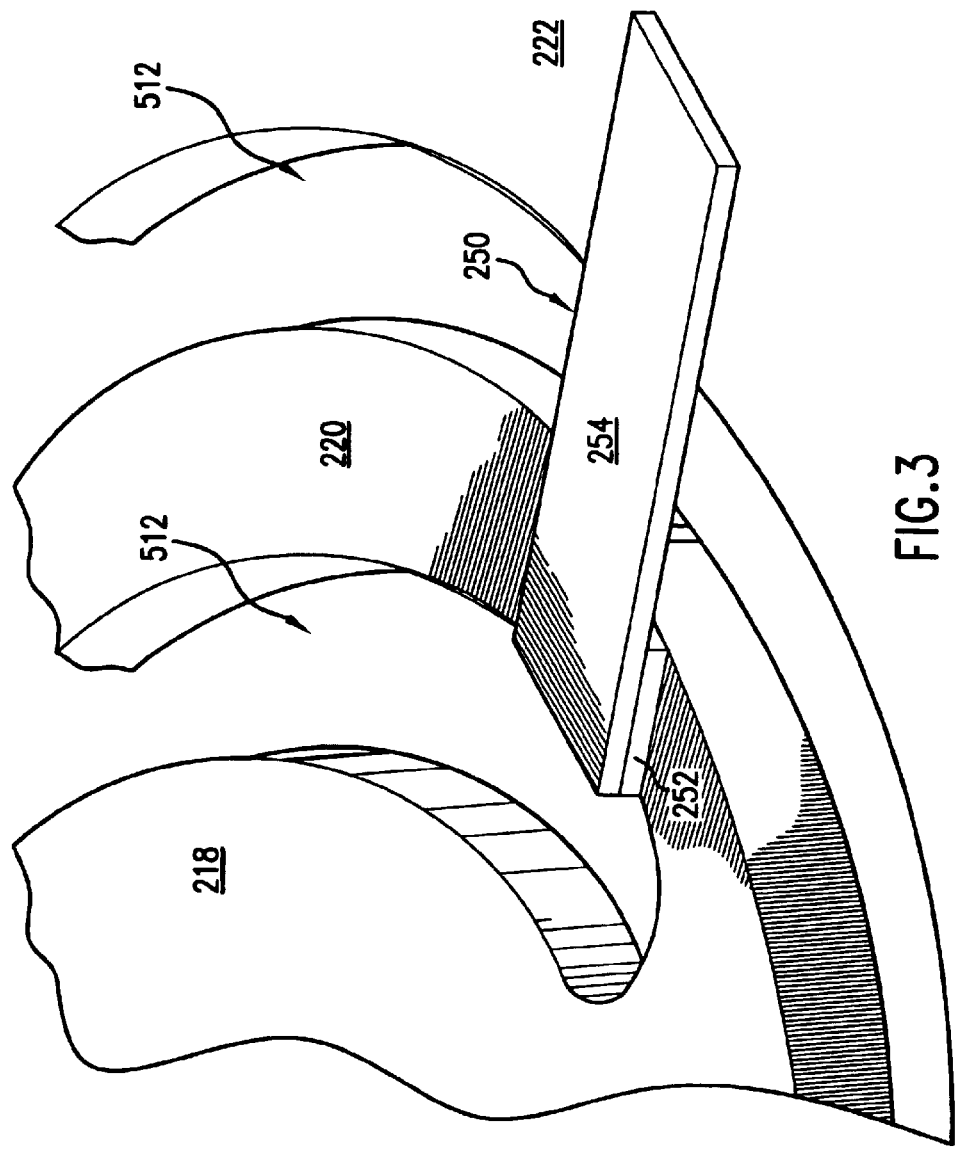
FIG. 3 is a perspective of view of another implementation of the membrane structure with tabs according to the present invention.

FIG. 3 shows exemplary tab 250 from the side. Specifically, the tabs 250 each comprise a base or vertical offset portion 252 and an overhanging or cantilevered portion 254. The cantilevered portion 254 extends in the direction of the adjacent tether or the outer portion 222. The offset portion 252 sets the vertical distance between the overhanging portion 254 and the adjacent tether or outer portion and thus the amount the membrane will deflect before experiencing increased rigidity because of the tabs 250.

Figure 4:
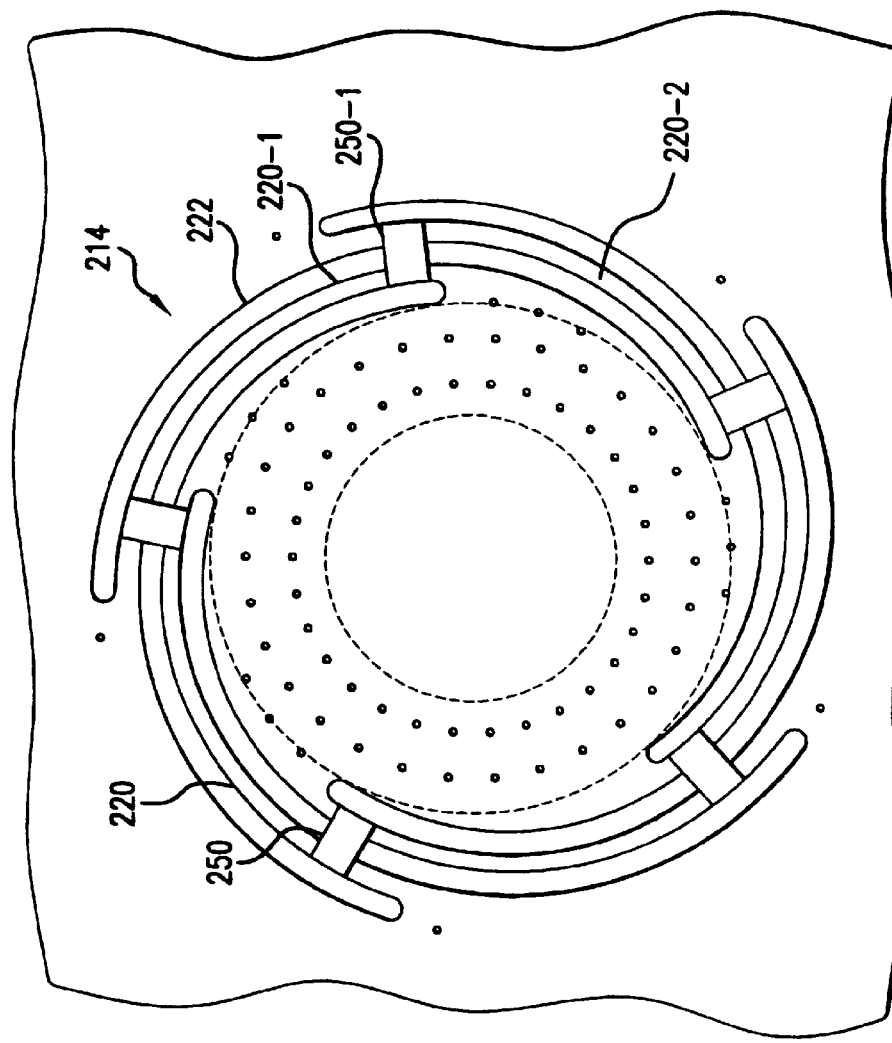
FIG. 4 is a close-up perspective view showing the inventive tab structure.

FIG. 4 shows another embodiment of the membrane structure 214 with tabs 250 extending between tethers 220. For example, tab 250-1 is fabricated to be connected to tether 220-1 and engages tether 220-2 upon full out-of-plane deflection of membrane structure 214.

FIGS. 5A through 5E illustrate a process for fabricating a membrane structure 214 with tabs or stops 250, according to the principles of the present invention.

Figure 5A:
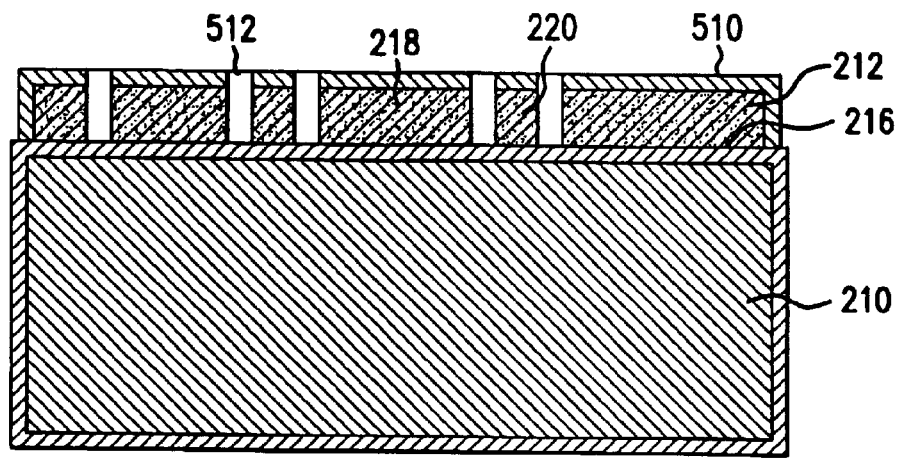
FIGS. 5A through 5E illustrate a process for fabricating the membrane structure with the tabs.

With reference to FIG. 5A, the exemplary process steps are tailored for a device formed using an silicon-on-insulator (SOI) wafer as the starting material, with a covering of oxide 510. The buried oxide layer 216, between the handle material 210 and the membrane layer 212, is used as the sacrificial release layer.

The membrane layer 212 is patterned to define the membrane body 218 and the tethers 220. Reactive ion etching (RIE) or deep RIE can be used for this purpose. The etch stops on the buried oxide layer.

Figure 5B:
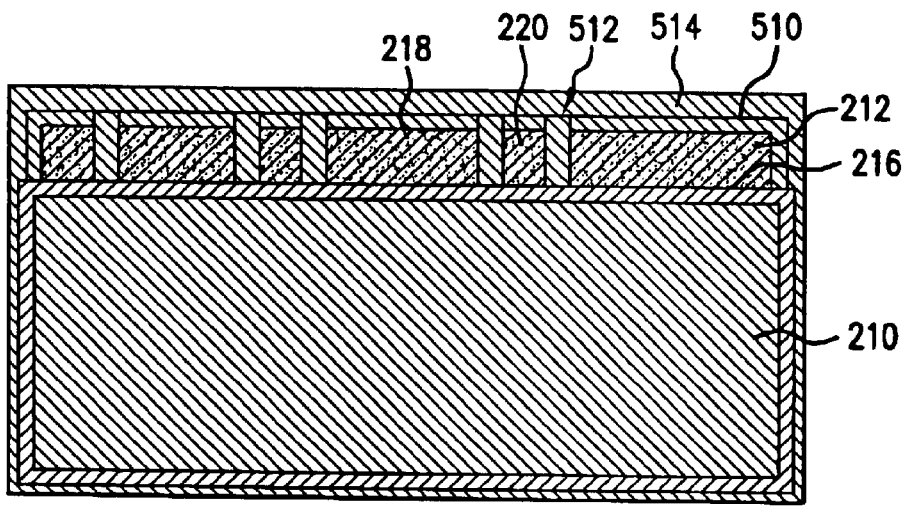

Referring to FIG. 5B, a conformal layer 514 is used to fill the vias 512, which define the tethers 220 and which the tabs 254 will bridge in some embodiments. TEOS is a good candidate for this purpose since it is very conformal and can be etched away during the release step. The width of the vias 512 is limited by the thickness of TEOS that can be deposited in some implementations. The vias 512 can be less than twice the deposited thickness so that they are completely filled. In one embodiment, the thickness of the deposited film sets the gap between the tabs and the stops or the thickness of the base or offset 252. If film thicknesses exceeding the desired gap height are required for refill purposes, then it is possible to use a blanket etch or polishing process (or combination of the two) to thin the film deposited on the top surface of the wafer.

Figure 5C:
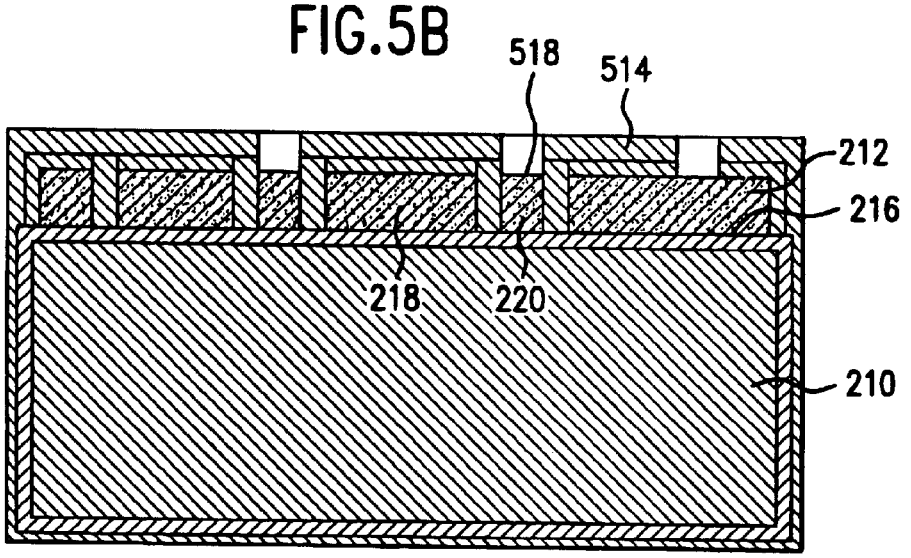

Referring to FIG. 5C, the deposited oxide layer 514 is patterned to reveal anchor points 518 to which the tabs will be anchored.

Figure 5D:
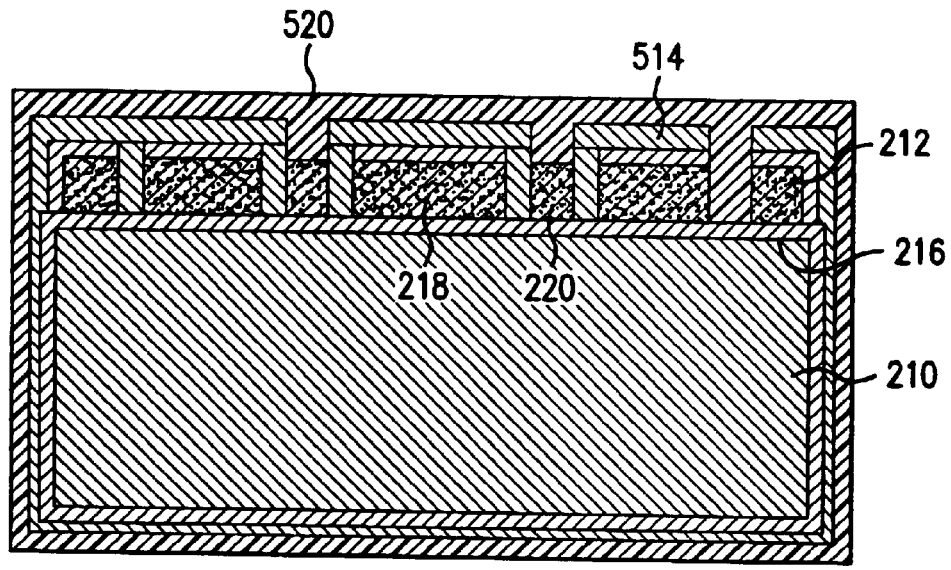

Referring to FIG. 5D, a tab layer 520 is deposited conformally over the wafer. LPCVD polysilicon deposition is capable of providing conformal coverage for the feature sizes indicated. A two micrometer polysilicon layer is used.

Figure 5E:
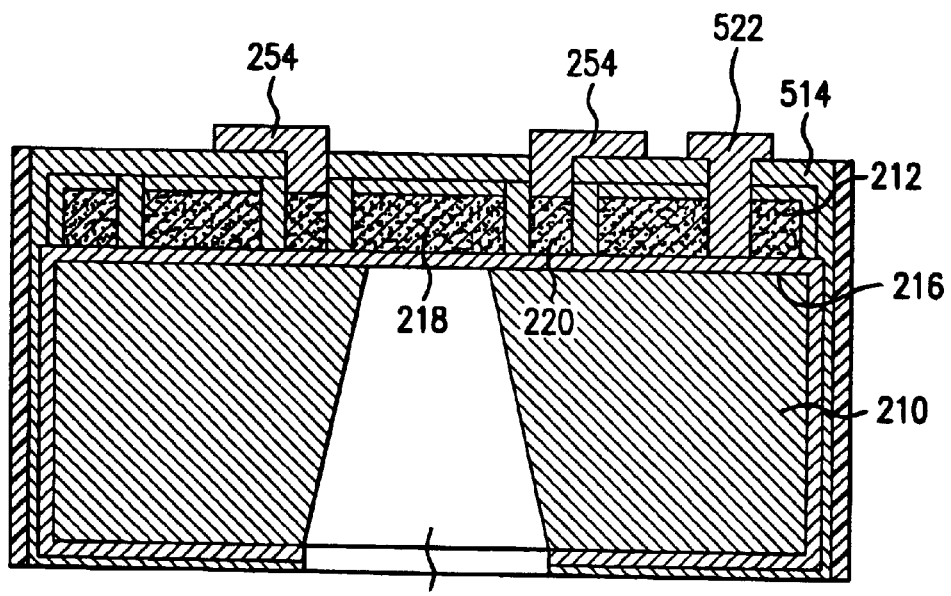

Referring to FIG. 5E, the deposited polysilicon 520 is patterned to define the tab structures 250. RIE etching is currently used for this purpose. The geometry of the tabs 250 is typically tailored to minimize the contact area between the tab 254 and the stop region that they contact. An optical port 101 is also formed, along with an electrical via 522 to the handle material 210.

Finally, the membrane structure with the attached tabs 250 is released using a hydrofluoric acid to etch away the sacrificial oxide layer 216 and oxide layer 514.

The current method allows stops to be attached to the top of the membrane structure. This has two primary advantages: 1) the processing remains on the top surface of the MEMS device allowing more flexibility in setting the maximum range of movement as well as the choice of materials and ordering of process steps; and 2) the tabs and the stops can be produced such that they are at the same electrical potential, avoiding large current flows when contact is made.

While this invention has been particularly shown and described with references to preferred embodiments thereof, it will be understood by those skilled in the art that various changes in form and details may be made therein without departing from the scope of the invention encompassed by the appended claims. For example, the description has been relative embodiments where the out-of-plane movement that is to be controlled is in the direction of the support structure. Movement away from the support structure is controlled by tabs that are connected to the outer portion of the membrane structure and that are cantilevered over the released portion of the structure, such as the body or tethers.

What is claimed is:

1. An electrostatically driven optical membrane, comprising:
   a support structure;
   a membrane structure separated from the support structure by an electrostatic cavity; and
   a tab on the membrane structure that increases a rigidity of the membrane structure to deflection after a predetermined amount of deflection;
   wherein the tab comprises a cantilevered portion that engages the membrane structure after deflection.

2. An electrostatically driven optical membrane, comprising:
   a support structure;
   a membrane structure separated from the support structure by an electrostatic cavity; and
   a tab on the membrane structure that increases a rigidity of the membrane structure to deflection after a predetermined amount of deflection;
   wherein the membrane structure comprises a tether connecting a membrane body to an outer portion.

3. An optical membrane as claimed in claim 2, wherein a base of the tab is connected to the tether.

4. An optical membrane as claimed in claim 2, wherein a base of the tab is connected to the outer portion.

5. An optical membrane as claimed in claim 1, wherein a base of the tab is connected to the membrane structure.

6. An electrostatically driven optical membrane, comprising:
   a support structure;
   a membrane structure separated from the support structure by an electrostatic cavity; and
   a tab on the membrane structure that increases a rigidity of the membrane structure to deflection after a predetermined amount of deflection;
   wherein the tab extends radially on the membrane structure.

* * * * *